United States Patent [19]

Irwin et al.

[11] 4,110,704
[45] Aug. 29, 1978

[54] ASTABLE MULTIVIBRATOR WITH TEMPERATURE COMPENSATION AND REQUIRING A SINGLE SUPPLY VOLTAGE

[75] Inventors: James Stuart Irwin; Merle Lee Gilmore, both of Ft. Lauderdale, Fla.

[73] Assignee: Motorola Inc., Schaumburg, Ill.

[21] Appl. No.: 834,076

[22] Filed: Sep. 19, 1977

[51] Int. Cl.² .......................................... H03K 3/282
[52] U.S. Cl. ................................. 331/113 R; 331/111
[58] Field of Search ............... 331/108 C, 108 D, 111, 331/113 R; 307/291

[56] References Cited

U.S. PATENT DOCUMENTS 3,668,656   6/1972   Hoggar .............................. 307/291

Primary Examiner—John Kominski
Attorney, Agent, or Firm—Margaret Marsh Parker; James W. Gillman

[57] ABSTRACT

A multivibrator utilizing two split inverter pairs of MOSFETS and requiring a supply voltage less than the sum of the threshold voltages of the complementary P-N channel devices. The transconductances of each pair are balanced to provide temperature compensation. MOS capacitors can also be utilized. Good frequency stability and low current drain are inherent in the design.

10 Claims, 2 Drawing Figures

ASTABLE MULTIVIBRATOR WITH TEMPERATURE COMPENSATION AND REQUIRING A SINGLE SUPPLY VOLTAGE

BACKGROUND OF THE INVENTION

This invention relates to the field of multivibrators, and more particularly to astable temperature-compensated multivibrators, requiring a single low voltage supply such as a mercury or silver oxide cell, and adaptable to C-MOS construction.

Astable multivibrators are well known in the art and are known to utilize complementary MOS devices. Typically, however, they require a power supply voltage greater than the sum of the threshold voltages of the P and N channel devices, and are either not temperature compensated or require additional components for that purpose. In many of the miniature products now being designed, only a single voltage cell can be tolerated because of size, weight or both. Since discrete components as capacitors are much larger than their equivalents on a chip, it is most desirable to be able to use capacitors formed as transistors are formed. Cost is also a factor in preferring MOS capacitors to discrete elements.

SUMMARY OF THE INVENTION

It is therefore an object of this invention to provide an astable multivibrator which requires only a single cell voltage supply.

It is another object to provide such a multivibrator which is inherently temperature compensated and which is compatible with C-MOS construction techniques.

The above objects and others are provided in the circuit in accordance with the invention and suitable for C-MOS integrated circuit construction. The circuit includes two inverter pairs, the output of each of which will switch from low to high when the current sink capability of one MOSFET of the pair, which is always biased above threshold, is exceeded by the current source capability of the other MOSFET. The latter MOSFET is controlled by an alternately switched pair of MOSFETS and a series resistor-capacitor network which is enabled by one of the multivibrator outputs. One inverter pair, and thus one portion of the multivibrator period, is fixedly controlled by a reference voltage; the other pair, and the other portion of the period, is controllable from off chip. The circuit requires little current and can operate with a supply voltage less than the sum of the threshold voltages of the inverter pair.

DETAILED DESCRIPTION OF A PREFERRED EMBODIMENT

Figure 1:
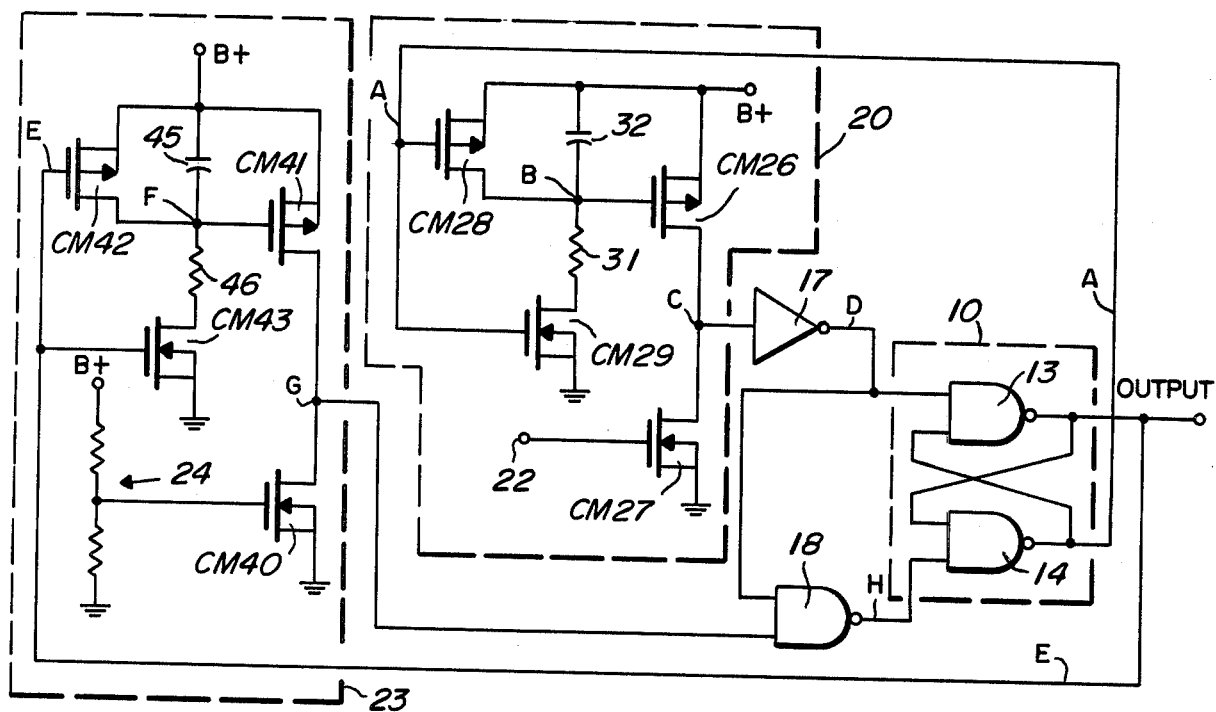
FIG. 1 is a logic diagram of the circuitry in accordance with the invention.

The logic diagram of FIG. 1 may best be described in terms of the three major sections thereof. A block 10 indicated by dashed lines is a conventional multivibrator R-S flip-flop comprising NAND gates 13 and 14. Logic elements, inverter 17 and NAND gate 18, provide the proper inputs to the flip-flop 10. A block 20 indicated by a dashed line includes a split inverter pair and its associated control elements, coupled to a modulation or control voltage input 22. A block 23 indicated by a dashed line contains elements almost identical to those in the block line 20 but instead of the control voltage input, there is a reference voltage source 24, which may be a tapped voltage divider.

Block 20 includes four C-MOSFETS 26–29, a resistor 31 and a capacitor 32, all except the resistor being formed at one time on a semiconductor chip. The capacitor is easily fabricated on the chip because one of its terminals is connected as the common B+. The circuit of FIG. 1 may form only a portion of the circuitry on a chip. CM 26 and CM 27 comprise the split inverter pair and CM 28 and CM 29 provide switching functions. CM 26, a p-channel MOSFET (or IGFET), is connected in series with the n-channel CM 27 between B+ and ground. The gate of CM 27 is coupled to the modulation voltage at the terminal 22. As will be seen hereinafter, this modulation voltage controls the length of the period M (FIG. 2) of the output. The gate of CM 26 is coupled to a point 34 which also couples CM 28 to capacitor 32 and, through the resistor 31, to CM 29.

As mentioned hereinabove, section 23 is very similar to section 20. Two MOSFETS, CM 40 and CM 41, form the split inverter pair, MOSFETS CM 42 and CM 43 provide the switching functions and a capacitor 45 and a resistor 46 provide the charging and time constant for the switching. The gate of CM 40 is coupled to a tap on the voltage divider 24 which is coupled between B+ and ground. In both blocks 20 and 23, all B+'s are common, as are all grounds.

Figure 2:
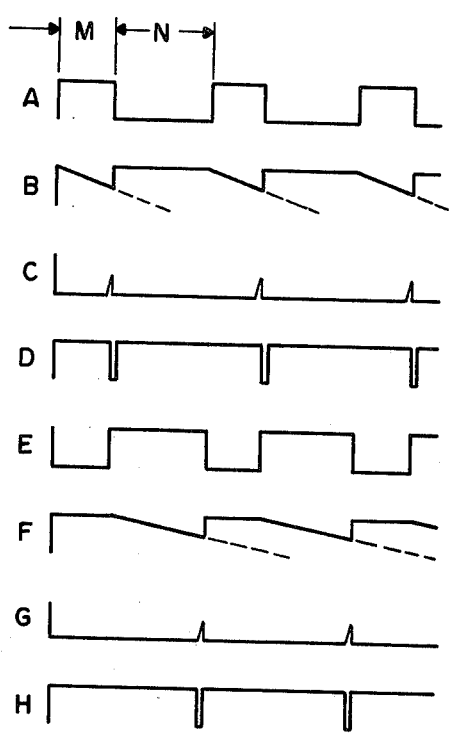
FIG. 2 is a timing diagram of the signals at specified points in the diagram of FIG. 1.

The functional description of FIG. 1 will be made with reference to the signals of the timing chart in FIG. 2. CM 26 serves as a variable load for CM 27, the voltage across the series pair being essentially the supply voltage and the voltage across CM 27 being fed to the inverter 17. The current in the pair must, of course, be the same, and is the lower of the respective allowable currents. Therefore, if the current in CM 26 is less than that which would be allowable in CM 27, (because of the modulation voltage on terminal 22) the voltage across CM 27 will drop to the voltage level appropriate for that combination of current and the $V_{GS}$ of CM 26. The $V_{GS}$ on CM 26 is determined by the two switching elements CM 28 and CM 29 plus the time constant of the RC network including resistor 31 and capacitor 32. Since CM 28 (p-channel) and CM 29 (n-channel) are complementary devices, the configuration is effectively a series RC with one shorting switch across the capacitor and one in series with the network between the point 34 and ground. When a high voltage from one output of the flip-flop 10 is applied to the gates of CM 28 and CM 29 (see A, FIG. 2), it prevents CM 28 from conducting, while at the same time CM 29 is effectively a short circuit and capacitor 32 begins charging. Conversely, as soon as the output of flip-flop 10 changes to a low voltage, the capacitor 32 discharges immediately through CM 28, signal B, and ceases flowing through the resistor 31. Current drain through these devices is therefore minimal because there is no static current drain.

For a given modulation voltage, CM 27 would have a relatively constant current if CM 26 were not present to limit the current and drop the output voltage C. This voltage C of the block 20 is held low except for the short period when the current source capability of CM 26 exceeds the current sink capability of CM 27. The voltage C is inverted by inverter 17 and, as signal D, triggers the flip-flop 10 and is also coupled to one input of the NAND gate 18. It is the nature of voltage C which is responsible for the excellent frequency stability of this multivibrator circuit at low supply voltages. During the time voltage C is rising to a level appropriate for inverter 17 to switch on, both CM 26 and CM 27 are conducting and therefore provide a well defined voltage for inverter 17. In prior art configuration devices these control elements are both off at this crucial part of the period, giving rise to an undefined voltage C which is susceptible to temperature and other variations. To reduce current drain, however, CM 26 is only on as long as is required for switching to be complete, at which time it is turned off by the action of flip-flop 10 (voltage A) and CM 28 and CM 29. To further increase the frequency stability with temperature variation, the geometries of CM 26 and CM 27 are chosen such that when they are conducting equal currents they have equal transconductances. In this manner the effects of the three millivolts per degree centigrade change (typical) in the threshold voltages of CM 26 and CM 27 will cancel. Thus, voltage C, and hence the frequency, does not change significantly with temperature.

The block 23 operates in a fashion almost identical to block 20. The gate voltage $V_{GS}$ of the CM 40 is held constant at a fixed reference voltage by a tap on the voltage divider 24. The time interval N is thus held essentially constant. The output G of the block 23 is the second input for the NAND gate 18. The control voltage E for the switching pair CM 42 and CM 43 is the second output of the flip-flop 10 and is essentially $\overline{A}$. The values of the elements determining the time constant for the block 23, i.e., capacitor 45 and resistor 46 are not necessarily the same as those of capacitors 32 and resistor 31 respectively, since these four element values are chosen to provide the desired frequency and modulation sensitivity.

Thus there has been provided, by a circuit in accordance with the invention, an astable multivibrator which is particularly well suited to C-MOS construction techniques. The only off-chip elements required are the resistors 31 and 46. The other connecting points of the chip are B+, ground, a control terminal and an output terminal. The circuit works with excellent frequency stability even with low supply voltage. In addition to the low current drain through the switching pairs of MOSFETS, the current drain is kept low because CM 26 and CM 41 are "on" for only a brief interval. As is known in digital logic technology, the circuit of the invention could be implemented by other logic elements yet still fall within the spirit and scope of the appended claims.

What is claimed is:

1. An astable multivibrator comprising in combination:
    first input means for providing a control signal;
    first semiconductor means coupled for being controlled by the control signal;
    second semiconductor means coupled in series with the first semiconductor means;
    first switching means coupled to control the second semiconductor means;
    supply means for supplying a reference signal;
    third semiconductor means coupled for being controlled by the reference signal;
    fourth semiconductor means coupled in series with the third semiconductor means;
    second switching means coupled to control the fourth semiconductor means; and
    multivibrator means coupled to receive the outputs of the series connected semiconductor pairs for being triggered by said outputs, the outputs of the multivibrator being coupled to enable the first and second switching means, and at least one output of the multivibrator means being coupled to an output terminal.

2. An astable multivibrator according to claim 1 and wherein the series pairs of semiconductor means comprise one n-channel field effect transistor and one p-channel field effect transistor.

3. An astable multivibrator according to claim 1 and wherein each of the switching means includes a pair of alternately enabled transistors, a capacitor and means for charging said capacitor over a predetermined period of time and discharging said capacitor rapidly.

4. An astable multivibrator according to claim 3 and wherein the charge on one of said capacitors is coupled to the second semiconductor means and the charge on the other of said capacitors is coupled to the fourth semiconductor means.

5. An astable multivibrator according to claim 3 and wherein each of said pairs of transistors in said switching means includes one n-channel field effect transistor and one p-channel field effect transistor.

6. An astable multivibrator according to claim 1 wherein the multivibrator includes two NAND logic gates.

7. An astable multivibrator according to claim 1 and further including logic means coupled between said semiconductor means outputs and said multivibrator inputs.

8. An astable multivibrator according to claim 1 and further including logic means coupled for preventing latching of said multivibrator and wherein the logic means includes an inverter means coupled between one semiconductor pair output and a first input of said multivibrator; and
    a NAND logic gate having a first input coupled to the other semiconductor pair output, a second input coupled to said inverter means output, and the output of said NAND gate coupled to a second input of the multivibrator means.

9. An astable multivibrator according to claim 1 and further including a voltage supply source and wherein the supply means comprises a voltage divider coupled to the voltage supply source for providing a reference voltage lower than the supplied voltage.

10. An astable multivibrator according to claim 1 wherein each series pair comprises an n-channel field effect transistor and a p-channel field effect transistor, each switching means includes an n-channel field effect transistor, a p-channel field effect transistor and a capacitor, said transistors and said capacitors being formed on a semiconducting base.

* * * * *